United States Patent [19]
Yoshida et al.

[11] Patent Number: 5,252,431
[45] Date of Patent: Oct. 12, 1993

[54] METHOD FOR PREPARING LITHOGRAPHIC PRINTING PLATES NOT REQUIRING DAMPENING WITH WATER

[75] Inventors: Susumu Yoshida; Seizi Shigetaka; Koji Furukawa, all of Shizuoka, Japan

[73] Assignee: Fuji Photo Film Co., Ltd., Ashigara, Japan

[21] Appl. No.: 757,295

[22] Filed: Sep. 10, 1991

[30] Foreign Application Priority Data

Sep. 12, 1990 [JP] Japan .................. 2-241445

[51] Int. Cl.$^5$ .............................................. G03F 7/30
[52] U.S. Cl. .................................... 430/303; 430/309; 430/326; 430/331
[58] Field of Search ............... 430/303, 302, 309, 331, 430/272, 326; 354/325, 317, 324, 328, 322; 101/463.1, 453, 457, 467

[56] References Cited

U.S. PATENT DOCUMENTS

| | | | |
|---|---|---|---|
| 4,142,194 | 2/1979 | Hamlin | 354/318 |
| 4,196,018 | 4/1980 | Inoko et al. | 134/6 |
| 4,371,250 | 2/1983 | Wakabayashi et al. | 354/325 |
| 4,428,659 | 1/1984 | Howard | 430/309 |
| 4,588,277 | 5/1986 | Buckler | 101/463.1 |
| 4,959,296 | 9/1990 | Yoshida et al. | 430/302 |
| 5,055,870 | 10/1991 | Ohba et al. | 354/325 |

FOREIGN PATENT DOCUMENTS

| | | | |
|---|---|---|---|
| 0383314 | 8/1990 | European Pat. Off. | 430/303 |
| 60-59351 | 4/1985 | Japan | 430/309 |
| 2-250056 | 10/1990 | Japan | 430/300 |
| 89/11924 | 12/1989 | PCT Int'l Appl. | |
| 2048515 | 10/1980 | United Kingdom | |

Primary Examiner—Marion E. McCamish
Assistant Examiner—Janis L. Dote
Attorney, Agent, or Firm—Burns, Doane, Swecker & Mathis

[57] ABSTRACT

A method for preparing a lithographic printing plate not requiring dampening with water comprising the steps of imagewise exposing to light a presensitized plate for use in preparing a lithographic printing plate not requiring dampening with water which comprises a substrate provided thereon with a light-sensitive layer and a silicone rubber layer in that order and then spraying a pressurized liquid on the plate surface to remove the silicone rubber layer of the image areas. The method does not require the use of brush rolls or developing pads which directly come in contact with the plate surface and give rise to wear and/or bending. Therefore, the method always ensures excellent quality and uniformity of development. Further, the method may be carried out repeatedly with less maintenance of equipment since it is not necessary to use any developing pad or brush roll which must frequently be exchanged due to wear or bending.

14 Claims, No Drawings

METHOD FOR PREPARING LITHOGRAPHIC PRINTING PLATES NOT REQUIRING DAMPENING WITH WATER

BACKGROUND OF THE INVENTION

1. Field of the Invention

The present invention relates to a method for preparing a lithographic printing plate not requiring dampening with water which comprises a silicone rubber layer as an ink-repellent layer. The method of the present invention is capable of developing a presensitized lithographic printing plate for use in preparing lithographic printing plate not requiring dampening with water in excellent development quality with easy maintenance and less wastage of developing equipment.

2. Prior Art

As lithographic printing plates not requiring dampening with water which have a silicone rubber layer as an ink-repellent layer, there have been known, for instance, those disclosed in Japanese Patent Publication for Opposition Purpose (hereinafter referred to as "J.P. KOKOKU") Nos. Sho 46-16044 (U.S. Pat. No. 3,511,178), Sho 54-26923 (U.S. Pat. No. 3,894,873), Sho 55-22781 (=Brit. Pat. 1,419,643), Sho 56-23150 and Sho 61-616 (U.S. Pat. No. 4,358,522). A presensitized original plate for use in preparing lithographic printing plate not requiring dampening with water (hereinafter referred to as "a dry PS plate") is imagewise exposed to light by any known method, then the plate surface is rubbed with a sponge, nonwoven fabric, gauze or developing pad in the presence of a developer to remove the silicone rubber layer on the image areas of the plate and to thus give a lithographic printing plate not requiring dampening with water. When the development of an imagewise exposed PS plate is performed by an automatic developing machine, the silicone rubber layer on the image area of the plate has currently been removed by scrubbing away with 1 to 3 brush rollers positioned such that they come in contact with the surface of the plate while conveying the dry PS plate by rollers as disclosed in Japanese Unexamined Patent Publication (hereinafter referred to as "J.P. KOKAI") Nos. Sho 60-59351 and Sho 63-163357.

However, in the method for removing the silicone rubber layer by rubbing the plate surface with the developing pad, uneven force is inevitably applied to the plate surface. This is liable to result in uneven development and if a large number of dry PS plates are treated, the pad wears out and this requires a very long treating time and a great deal of labor.

Furthermore, the use of an automatic developing machine equipped with brush rolls suffers from severe problems of, for instance, reduction of half-tone dot reproducibility and occurrence of uneven development along the widthwise direction of the brush rolls due to wear or bending of the bristles of the brush rolls which becomes more serious as the number of processed PS plates is increased.

SUMMARY OF THE INVENTION

Accordingly, an object of the present invention is generally to solve the foregoing problems associated with the conventional methods and more particularly to provide a method for preparing a lithographic printing plate not requiring dampening with water which is capable of developing a light-exposed dry PS plate uniformly in an excellent development quality with easy maintenance and less wastage of developing equipment.

The inventors of this invention have conducted various studies to solve the foregoing problems, have found out that the problems can be solved by spraying the imagewise exposed surface of a dry PS plate with a pressurized liquid such as water or an aqueous solution mainly comprising water to remove the silicone rubber layer of the image areas and thus have completed the present invention.

Thus, the present invention relates to a method for preparing a lithographic printing plate not requiring dampening with water which comprises the steps of exposing imagewise to light a dry PS plate comprising a substrate provided thereon with a light-sensitive layer and a silicone rubber layer in that order and then spraying the plate surface with a pressurized liquid to remove the silicone rubber layer of the image area.

DETAILED DESCRIPTION OF THE PREFERRED EMBODIMENTS

The present invention will hereinafter be explained in more detail.

In the exposure process of the method, a dry PS plate which comprises a substrate provided thereon with a light-sensitive layer, a silicone rubber layer and an optional protective film is brought into close contact with a positive or negative film using the usual vacuum printing frame for lithographic printing plates and then irradiated with actinic light rays through the film. The light sources used in the exposure process are those capable of emitting light rays rich in ultraviolet rays and examples thereof include a mercury lamp, carbon arc lamp, xenon lamp, metal halide lamp and fluorescent tube.

Then after removing the protective film if it is present, a pressurized liquid is sprayed on the plate surface of the imagewise exposed PS plate to remove the silicone rubber layer on the image area. This process can be performed by dipping the entire PS plate in a treating liquid or uniformly coating the plate surface with the treating liquid by a sponge, nonwoven fabric or gauze and then spraying a pressurized liquid on the plate surface. The pressurized liquid to be sprayed may be identical to or different from the treating liquid for the dipping or coating step. In particular, if the foregoing treatment is carried out in an automatic developing machine, the dipping or coating step with the treating liquid and the spraying step with the pressurized liquid for removing the silicone rubber layer of the image area are carried out in the same zone or separate zones. Further, the dipping step and the spraying step may be simultaneously carried out. In addition, the removal of the silicone rubber layer may also be performed by simply spraying the pressurized liquid without any dipping treatment.

In addition to the spray of the pressurized liquid, the plate surface is rubbed with a brush roller or developing pad to remove the silicone rubber layer. Moreover, a part or whole of the light-sensitive layer on the image area may be removed simultaneously with the removal of the silicone rubber layer.

Examples of the pressurized liquid used in the method include water; alcohols such as methanol, ethanol, n-propanol, isopropanol, 3-methoxybutanol, 3-methyl-3-methoxybutanol, ethyl carbitol, butyl carbitol, ethyl cellosolve, butyl cellosolve, benzyl alcohol and n-amyl alcohol; glycols such as 1,2-butanediol, 1,3-butanediol, 1,4-butanediol, ethylene glycol, diethylene glycol, triethylene glycol, propylene glycol, dipropylene glycol, tripropylene glycol, polypropylene glycol and addition reaction products of polypropylene glycol and ethylene oxide; esters such as diethyl succinate, dimethyl phthalate, benzyl benzoate, ethylene glycol diacetate, ethyl acetate, butyl acetate, ethyl cellosolve acetate, carbitol acetate, methyl benzoate, triethyl phosphate, methyl lactate, ethyl lactate, diethyl oxalate and isobutyl acetate; ketones such as acetone, methyl ethyl ketone, cyclohexanone, diisobutyl ketone, acetophenone and isophorone; ethers such as ethyl ether, dioxane, tetrahydrofuran, diethylene glycol dimethyl ether, triethylene glycol dimethyl ether, triethylene glycol monomethyl ether, tripropylene glycol monomethyl ether, tripropylene glycol monobutyl ether, tripropylene glycol dimethyl ether, tetraethylene glycol monomethyl ether, tetraethylene glycol dimethyl ether, ethylene glycol mono-n-hexyl ether, diethylene glycol mono-n-hexyl ether, ethylene glycol monophenyl ether, ethylene glycol dibutyl ether, diethylene glycol di-n-butyl ether, ethylene glycol benzyl ether, diethylene glycol monomethyl ether, diethylene glycol mono-n-pentyl ether, diethylene glycol mono-n-heptyl ether, diethylene glycol monooctyl ether, ethylene glycol mono-n-pentyl ether, ethylene glycol mono n-heptyl ether, ethylene glycol monooctyl ether, propylene glycol monobutyl ether, propylene glycol monopentyl ether, propylene glycol mono-n-hexyl ether, propylene glycol monoheptyl ether, propylene glycol monooctyl ether, dipropylene glycol monomethyl ether, dipropylene glycol monobutyl ether, dipropylene glycol monopentyl ether, dipropylene glycol mono-n-hexyl ether, dipropylene glycol monooctyl ether and diethylene glycol monooctenyl ether; amines such as methylamine, ethylamine, dimethylamine, trimethylamine, triethylamine, propylamine, butylamine, amylamine, dipropylamine, dibutylamine, diamylamine, tripropylamine, tributylamine, methyldiethylamine, ethylenediamine, trimethylenediamine, tetramethylenediamine, benzylamine, N,N-dimethylbenzylamine, N,N-diethylbenzylamine, o-, m- or p methoxy or methylbenzylamine, N,N-di(methoxybenzyl) amine, β-phenylethylamine, γ-phenylpropylamine, cyclohexylamine, α- or β-naphthylamine, o-, m- or p-phenylenediamine, monoethanolamine, diethanolamine, triethanolamine, 2-methylaminoethanol, 2-ethylaminoethanol, 2-(2-aminoethyl)ethanol, 2-amino-2-methyl-1,3propanediol, 2-amino-1,3-propanediol, 2-amino-2-hydroxymethyl-1,3-propanediol, 3-methoxypropylamine, 3-ethoxypropylamine, 3-propoxypropylamine, 3-isopropoxypropylamine, 3-butoxypropylamine, 3-isobutoxypropylamine, 2-ethylhexyloxypropylamine, 2-ethoxyethylamine, 2-propoxyethylamine and 2-butoxyethylamin organic acids such as lactic acid, acetic acid, propionic acid, n-butyric acid, isobutyric acid, n-valeric acid, isovaleric acid, methylethylacetic acid, trimethylacetic acid, caproic acid, isocaproic acid, α-methylvaleric acid, 2-ethyl-n-butyric acid, enanthic acid, caprylic acid and 2-ethylhexanoic acid; aliphatic hydrocarbons such as hexane, heptane, "Isopar E, H and G" (trade names of aliphatic hydrocarbons available from ESSO Chemical Company), gasoline and kerosine; and aromatic hydrocarbons such as toluene and xylene. These liquids may be used alone or in combination. In addition, there may be used aqueous solutions containing one or more of the foregoing organic solvents and liquids comprising one or more of the foregoing solvents solubilized with a proper solubilizing agent or emulsified with a proper emulsifying agent.

In addition to the foregoing solvents, the pressurized liquid may further comprise inorganic salts, chelating agents, surfactants, dyes and/or other additives.

Among these pressurized liquids, particularly preferred are water and aqueous solutions mainly comprising water.

The pressure applied to the liquid during the spray in general ranges from 10 to 200 kg/cm$^2$, preferably 10 to 100 kg/cm$^2$. This is because, if the pressure is less than the lower limit, the development process requires a long time period or the PS plate is developed only insufficiently. On the other hand, if it is too high, the area to be retained is damaged and the process requires the use of a large scale machinery and tools and is unfavorable in view of cost.

The pressurized liquid is preferably sprayed on to the dry PS plate from a direction at an angle of 0° to 60° to an axis perpendicular to the surface of the plate. The spray treatment over the entire surface of the dry PS plate may be ensured by various methods, for example, by scanning the entire surface of the plate with one or a few spray nozzles or by conveying the plate in sprayed liquid coming out from many spray nozzles arrayed in a line or lines so that the entire surface of the plate is sprayed with the liquid from a suitable direction.

The temperature of the pressurized liquid desirably ranges from 5° to 80° C. and preferably 20° to 50° C.

As the treating solutions for dipping the dry PS plates, there can be used, for instance, those defined above in connection with the pressurized liquid.

The dry PS plate which can be used in the method of the present invention will now be explained in more detail below.

Substrate

The substrate for the dry PS plate used in the invention is a dimensionally stable plate-like material. Examples of such dimensionally stable plate-like material include those conventionally used as substrates for lithographic printing plates and all of them can suitably be used in the present invention. Specific examples thereof are paper; paper laminated with a plastic film such as a polyethylene, polypropylene or polystyrene film; metal plates such as aluminum (inclusive of aluminum alloys), zinc and copper plates; plastic films such as cellulose acetate, cellulose diacetate, cellulose triacetate, cellulose propionate, cellulose acetate butyrate, cellulose nitrate, polyethylene terephthalate, polyethylene, polypropylene, polystyrene, polycarbonate and polyvinyl acetal films; and paper or plastic films which are laminated with a foil of the foregoing metal or on which a layer of the foregoing metal is deposited. Among these, particularly preferred are aluminum plates because of the dimensional stability and low price thereof. Moreover, it is also preferred to use a composite sheet comprising a polyethylene terephthalate film and an aluminum sheet bonded together as disclosed in J.P. KOKOKU No. Sho 48-18327.

Primer Layer

The dry PS plate used in the present invention may comprise a primer layer for enhancing the adhesion between the light-sensitive layer and the substrate.

The primer layer used should fulfill the following requirements. That is, it should ensure the strong adhesion between the substrate and the light-sensitive layer, and it should be stable over a long period of time, and further it should have high resistance to attack of solvents for developers.

Specific examples of materials for the primer layer which satisfy these requirements include those containing epoxy resins as disclosed in J.P. KOKOKU No. Sho 61-54219, urethane resins, phenol resins, acrylic resins, alkyd resins, polyester resins, polyamide resins and melamine resins. The primer layer may also be obtained by photohardening a composition similar to that for the light-sensitive layer. In addition, the primer layer may comprise additives such as dyes and/or pigments for inhibiting halation or for other purposes.

The thickness of the primer layer preferably ranges from 1 to 50 g/m$^2$ expressed in terms of the coated amount (weighed after drying).

Light-Sensitive Layer

In the present invention, any light-sensitive layer may be used so far as the solubility thereof in a developer or the adhesion thereof to the upper layer, i.e., a silicone rubber layer at the interface of those layeres may be changed through light exposure. Both positive-working and negative-working light-sensitive layers can be treated by the method of the present invention.

Examples of compounds or compositions which can be used for forming such light-sensitive layers are as follows:

(A) Photopolymerizable Light-Sensitive Resin Layers

Light-sensitive resin layers formed from a photopolymerizable light-sensitive composition which comprises (i) a monomer or oligomer having an olefinically unsaturated double bond, (ii) an optional polymeric compound having a film-forming ability and (iii) a photopolymerization initiator;

Light-sensitive resin layers obtained from a light-sensitive composition comprising the foregoing components (i) to (iii) can be used provided that it comprises a polymeric compound formed by coupling the components (i) and (ii), i.e., a composition containing a polymer photopolymerizable or photocrosslinkable olefinically unsaturated double bonds on the side chains and a film-forming ability instead of the components (i) and (ii); and Light-sensitive resin layers obtained from a light-sensitive composition comprising the polymeric compound formed by coupling the components (i) and (ii) defined above and a monomer or oligomer (i) as defined above.

The latter is more preferably used in the present invention.

Component (i): Monomer or Oligomer Having an Olefinically Unsaturated Double Bonds Specific examples of such monomers or oligomers include monofunctional (meth)acrylates such as polyethylene glycol mono(meth)acrylate, polypropylene glycol mono(meth)acrylate and phenoxyethyl (meth)acrylate; polyfunctional (meth)acrylates such as polyethylene glycol di(meth)acrylate, trimethylolethane tri(meth)acrylate, neopentyl glycol di(meth)acrylate, pentaerythritol tri(meth)acrylate, pentaerythritol tetra(meth) acrylate, dipentaerythritol hexa(meth)acrylate, hexanediol di(meth)acrylate, trimethylolpropane tri(acryloyloxypropyl)ether, tri(acryloyloxyethyl)isocyanurate; (meth)acrylic acid salts such as calcium (meth)acrylate and sodium (meth)acrylate; compounds obtained by adding ethylene oxide or propylene oxide to polyfunctional alcohols such as glycerin or trimethylolethane and then converting the adducts into (meth)acrylates; urethane acrylates as disclosed in J.P. KOKOKU Nos. Sho 48-41708 and Sho 50-6034 and J.P. KOKAI No. Sho 51-37193; polyester acrylates as disclosed in J.P. KOKAI No. Sho 48-64183 and J.P. KOKOKU Nos. Sho 49-43191 and Sho 52-30490; epoxy acrylates obtained by reacting epoxy resins with (meth)acrylate; and N-methylol acrylamide derivatives as disclosed in U.S. Pat. No. 4,540,649. Moreover, it is also possible to use those disclosed in Journal of the Adhesion Society of Japan, Vol. 20, No. 7(1984), pp. 300–308 as photohardenable monomers and oligomers. The amount of these monomers and oligomers in general ranges from 70 to 1% by weight and preferably 50 to 3% by weight on the basis of the total weight of the light-sensitive resin layer.

Component (ii): Polymeric Compounds Having Film-Forming Ability

Examples of the polymeric compounds having film-forming ability include methacrylic acid copolymers, acrylic acid copolymers, crotonic acid copolymers, maleic acid copolymers, partially esterified maleic acid copolymers, acidic cellulose derivatives, polyvinyl pyrrolidone, polyethylene oxide, alcohol-soluble nylons, polyesters, unsaturated polyesters, polyurethanes, polystyrenes, epoxy resins, phenoxy resins, polyvinyl butyrals, polyvinyl formals, polyvinyl chlorides, polyvinyl alcohols, polyvinyl alcohols partially modified into acetal, water-soluble nylons, water-soluble urethane resins, gelatins and water-soluble cellulose derivatives.

Polymeric Compounds Formed by Coupling the Components (i) and (ii)

Examples of such polymeric compounds include allyl (meth) acrylate/(meth)acrylic acid/optional other addition-polymerizable vinyl monomers, and alkali metal or amine salts thereof as disclosed in J.P. KOKAI No. Sho 59-53836; reaction products of hydroxyethyl (meth)acrylate/(meth)acrylic acid/alkyl (meth)acrylate or alkali metal or amine salts thereof with (meth)acrylic acid chloride as disclosed in J.P. KOKOKU No. Sho 59-45979; addition products of maleic anhydride copolymers and pentaerythritol triacrylate through half-esterification, and alkali metal o amine salts thereof as disclosed in J.P. KOKAI No. Sho 59-71048; addition products of styrene/maleic anhydride copolymers with monohydroxyalkyl (meth)acrylate, polyethylene glycol mono(meth)acrylate or polypropylene glycol mono(meth)acrylate through half-esterification, and alkali metal or amine salts thereof; products obtained by reacting a part of carboxyl groups of (meth)acrylic acid copolymers or crotonic acid copolymers with glycidyl (meth)acrylate, and alkali metal or amine salts thereof; reaction products of hydroxyalkyl (meth)acrylate copolymers, polyvinyl formal or polyvinyl butyral with maleic anhydride or itaconic anhydride, and alkali metal or amine salts thereof; reaction products of hydroxyalkyl (meth) acrylate/(meth)acrylic acid copolymers with a 1:1 adduct of 2,4-tolylenediisocyanate/hydroxyalkyl (meth)acrylate, and alkali metal or amine salts thereof; (meth)acrylic acid copolymers partially reacted with allyl glycidyl ether, and alkali metal or amine salts thereof as disclosed in J.P. KOKAI No. Sho 59-53836; vinyl (meth)acrylate/(meth)acrylic acid copolymers and alkali metal or amine salts thereof; allyl (meth)acrylate/sodium styrenesulfonate copolymers; vinyl (meth)acrylate/sodium styrenesulfonate copolymers, allyl (meth)acrylate/sodium acrylamido-1,1-dimethylethylenesulfonate copolymers, vinyl (meth)acrylate/sodium acrylamido-1,1-dimethylethylenesulfonate copolymers, 2-allyloxyethyl methacrylate/methacrylic acid copolymers and 2-allyloxyethyl methacrylate/2-methacryloxyethyl hydrogen succinate copolymers. These polymeric compounds may be used alone or in combination.

The amount of the polymeric compounds generally ranges from 30 to 99% by weight and preferably 50 to 97% by weight on the basis of the total weight of the light-sensitive layer.

Component (iii): Photopolymerization Initiator

Examples of photopolymerization initiators usable in the present invention include vicinal polyketaldonyl compounds as disclosed in U.S. Pat. No. 2,367,660; α-carbonyl compounds as disclosed in U.S. Pat. Nos. 2,367,661 and 2,367,670; acyloin ether compounds as disclosed in U.S. Pat. No. 2,488,828; aromatic acyloin compounds which are substituted with a hydrocarbon group at the α-position as disclosed in U.S. Pat. No. 2,722,512; polynuclear quinone compounds as disclosed in U.S. Pat. No. 3,046,127 and 2,951,758; combinations of triaryl imidazole dimer/p-aminophenyl ketone as disclosed in U.S. Pat. No. 3,549,367; benzothiazole compounds as disclosed in U.S. Pat. No. 3,870,524; combinations of benzothiazole compounds and trihalomethyl-s-triazine compounds as disclosed in U.S. Pat. No. 4,239,850 acridine and phenazine compounds as disclosed in U.S. Pat. No. 3,751,259; oxadiazole compounds as disclosed in U.S. Pat. No. 4,212,970; trihalomethyl-s-triazine compounds having a chromophoric group as disclosed in U.S. Pat. Nos. 3,954,475 and 4,189,323 and J.P. KOKAI Nos. Sho 53-133428, Sho 60-105667, Sho 62-58241 and Sho 63-153542; peroxyester compounds having a benzophenone group as disclosed in J.P. KOKAI Nos. Sho 59-197401 and Sho 60-76503. These photopolymerization initiators may be used alone or in combination.

These photopolymerization initiators can be used in the light-sensitive layer in an amount ranging from 0.1 to 20% by weight, preferably 1 to 10% by weight on the basis of the total weight of the layer.

Other Components

In addition to the foregoing components, the light-sensitive resin layer may comprise a small amount of a photohardenable diazo resin to improve the adhesion to the primer layer. As such diazo resins, there may be mentioned, for instance, those disclosed in U.S. Pat. Nos. 3,867,147 and 2,632,703 and particularly useful are diazo resins represented by condensates of aromatic diazonium salts with active carbonyl-containing compounds (e.g., formaldehyde). Examples of preferred diazo resins include hexafluorophosphate, tetrafluoroborate and phosphate salts of a condensate of p-diazophenylamine with formaldehyde or acetaldehyde; and sulfonates (such as p-toluenesulfonate, dodecylbenzenesulfonate and 2-methoxy-4-hydroxy-5-benzoylbenzenesulfonate), phosphinate and organic carboxylate salts of a condensate of p-diazodiphenylamine with formaldehyde as disclosed in U.S. Pat. No. 3,300,309. The diazo resins are added to the light-sensitive layer in an amount preferably ranging from 0.1 to 5% by weight on the basis of the total weight of the light-sensitive layer.

It is preferred to further add a heat polymerization inhibitor to the light-sensitive resin layer. Examples thereof are hydroquinone, p-methoxyphenol, di-t-butyl-p-cresol, pyrogallol, t-butylcatechol, benzoquinone, 4,4′-thiobis(3-methyl-6-t-butylphenol), 2,2′-methylenebis(4-methyl-t-butylphenol) and 2-mercaptobenzimidazole.

Moreover, the light-sensitive layer may optionally comprise dyes or pigments for coloring the layer and/or pH indicators or leuco dyes as agents or compositions for obtaining a visible image immediately after the imagewise exposure. The light-sensitive layer may also optionally comprise a small amount of a silicone compound such as polydimethylsiloxane, methylstyrene modified polydimethylsiloxane, olefin-modified polydimethylsiloxane, polyether-modified polydimethylsiloxane, silane coupling agents, silicone diacrylate and silicone dimethacrylate depending on purposes of the layer. In addition, a fluorine atom-containing surfactant may be added to the light-sensitive layer for improving the coating properties of the composition. The amount of these additives is in general not more than 10% by weight on the basis of the total weight of the light-sensitive resin layer. Moreover, the light-sensitive layer may optionally comprise silica powder or hydrophobic silica powder whose surface is treated with a (meth)acryloyl or allyl group-containing silane coupling agent in an amount of up to 50% by weight on the basis of the total weight of the layer.

(B) Photodimerizable Light-Sensitive Layer

Examples of light-sensitive layers of this kind include those comprising a polymeric compound carrying, in the main chain or on the side chains, a group selected from those represented by the following formulae:

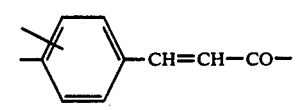

(a)

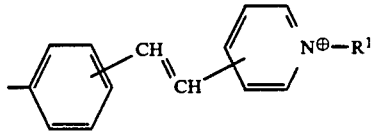

(b)

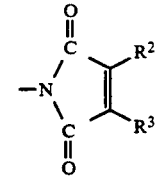

(c)

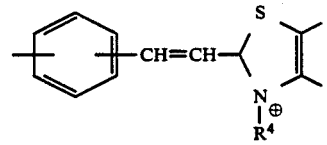

(d)

wherein $R^1$ represents an alkyl group having 1 to 10 carbon atoms; each of $R^2$ and $R_3$ represents an alkyl group or $R^2$ and $R^3$ may form together a 5- or 6-membered ring and $R^4$ represents an alkyl group having 1 to 10 carbon atoms).

Specific examples thereof include those mainly comprising a polyester, polyamide or polycarbonate carrying, in the main chain or on the side chains, the group (a) as a light-sensitive group such as the compounds disclosed in U.S. Pat. Nos. 3,030,208, 3,707,373 and 3,453,237; those mainly comprising a light-sensitive polyester derived from (2-propenylidene)malonic acid compound such as cinnamylidene malonic acid and a bifunctional glycol such as the light-sensitive polymers disclosed in U.S. Pat. Nos. 2,956,878 and 3,173,737; those mainly comprising a cinnamate ester of hydroxyl group-containing polymer such as polyvinyl alcohol, starch, cellulose and the like such as the light-sensitive polymers disclosed in U.S. Pat. Nos. 2,690,966, 2,752,372 and 2,732,301; and those mainly comprising the polymers as disclosed in J.P. KOKAI Nos. Sho 58-25302 and Sho 59-17550.

(C) Compositions Comprising Photohardenable Diazo or Azido Resin, Optional Photosensitizer, Minor Amount of Additive and Filler Examples of the photohardenable diazo resin include zinc chloride complex salts of condensates of diazo amines such as p-diazodiphenylamine, p-diazomonoe-thylaniline and p-diazobenzylethylaniline with formaldehyde.

This light-sensitive resin layer essentially differs from those exemplified in (A) in that it does not comprise any compound having a photopolymerizable unsaturated double bond.

Examples of photohardenable azido compounds include azidophthalate and azidobenzoate esters of polyvinyl alcohol and esters of styrene-maleic anhydride copolymer with aromatic azidoalcohols such as β-(4-azidophenol)ethanol.

Photosensitizers, fillers and additives usable in the composition are those listed above in connection with the photopolymerizable light-sensitive resin layers (A).

(D) Compositions Comprising o-Quinone Diazide Compounds:

Examples of particularly preferred o-quinone diazide compounds are disclosed in a variety of publications such as U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,046,123; 3,061,430; 3,102,809; 3,106,465; 3,635,709 and 3,647,443 and these compounds may preferably be used in the invention. Among these, particularly preferred are o-naphthoquin onediazidosulfonates or o-naphthoquinonediazidocarboxylates of aromatic hydroxyl compounds; o-naphthoquinonediazidosulfonic acid amides or o-naphthoquinonediazidocarboxylic acid amides of aromatic amine compounds, for instance, esters of benzoquinone-1, 2-diazidosulfonic acid or naphthoquinone-1,2-diazidosulfonic acid with polyhydroxyphenyl (hereinafter the term "ester" also include partial esters); esters of naphthoquinone-1,2-diazido-4-sulfonic acid or naphthoquinone-1,2-diazido-5-sulfonic acid with pyrogallol/acetone resins; esters of benzoquinone-1,2-diazidosulfonic acid or naphthoquinone-1,2-diazidosulfonic acid with novolak type phenol/formaldehyde resins or novolak type cresol/formaldehyde resins; amides of poly(p-aminostyrene) and naphthoquinone-1,2-diazido-4-sulfonic acid or naphthoquinone-1,2-diazido-5-sulfonic acid; esters of poly(p-hydroxystyrene) and naphthoquinone-1,2-diazido-4-sulfonic acid or naphthoquinone-1,2-diazido-5-sulfonic acid; esters of polyethylene glycol with naphthoquinone-1,2-diazido-4-sulfonic acid or naphthoquinone-1,2-diazido 5-sulfonic acid; amides of polymeric amines with naphthoquinone-1,2-diazido-4-sulfonic acid or naphthoquinone-1,2-diazido-5-sulfonic acid; esters of polymethacrylic acid p-hydroxyanilide with naphthoquinone-1,2-diazido-4-sulfonic acid or naphthoquinone-1,2-diazido-5-sulfonic acid; amides of amine-modified rosin (natural resin) with naphthoquinone-1,2-diazido-5 sulfonic acid; esters of epoxy resins obtained from bisphenol A and propylene oxide with naphthoquinone-1,2-diazido-5-sulfonic acid; esters of polymers derived from monoesters of (meth)acrylic acid and dihydroxyphenyl, with naphthoquinone-1,2-diazido-4-sulfonic acid or naphthoquinone-1,2-diazido-5-sulfonic acid; products obtained by polymerizing condensates of diallyl aminoisophthalate and naphthoquinonediazidosulfonic acid; products obtained by crosslinking quinonediazidosulfonate esters of polycarbonates or quinonediazides with isocyanates or the like; esters of bisphenol A with naphthoquinone-1,2-diazido-4-sulfonic acid or naphthoquinone-1,2-diazido-5-sulfonic acid; esters of naphthoquinone-1,2-diazido 5 sulfonic acid with phenols such as phenol and p cresol or alcohols such as ethyl, propyl, butyl and amyl alcohols; acid amides of naphthoquinone-1,2-diazido-5-sulfonic acid with amines such as aniline and p-hydroxyaniline.

The foregoing composition for the light-sensitive layer to which a surfactant such as those disclosed in U.S. Pat. Nos. 3,787,351; 4,487,823 and 4,822,713 has optionally been added is dissolved in an appropriate solvent such as 2-methoxyethanol, 2-methoxyethyl acetate, methyl lactate, ethyl lactate, propylene glycol monomethyl ether, methanol, ethanol, methyl ethyl ketone, water or mixture thereof and then applied onto the surface of a substrate. The coated amount of the composition desirably ranges from 0.1 to 10 g/m$^2$, preferably 0.5 to 5 g/m$^2$ (weighed after drying).

In the method of the present invention, the light-sensitive layer may or may not be removed during the developing process. If it is not removed during the developing process, the exposed light-sensitive layer serves as the image area and hence it is required for the light-sensitive layer to be easily dyed with a dyeing solution.

Silicone Rubber Layer

The silicone rubber layer of the dry PS plate used in the present method desirably has a thickness ranging from 0.5 to 50 μm, preferably from 0.5 to 5 μm. The silicone rubber useful in the invention can be obtained from so-called condensate type silicone rubber compositions which mainly comprise linear organopolysiloxanes (preferably polydimethylsiloxane) having a molecular weight ranging from 100 to 100,000 and capable of causing crosslinking through condensation between the end groups thereof; or so-called addition product type silicone rubber compositions which can provide silicone rubber layers through a reaction of linear organopolysiloxane having vinyl groups in the main chain or on the side chains with a crosslinking agent having methylhydrogensiloxane units in the presence of a platinum catalyst.

Protective Layer

The silicone rubber layer has ink-repellency, the surface thereof is somewhat sticky and hence dust or the like is liable to be adhered thereto. As a result, a positive or negative film is not satisfactorily adhered to the surface of the silicone rubber layer during the light-exposure process. For this reason, a thin transparent protective film is preferably applied to the surface of the silicone rubber layer. The protective film is effective in the exposure process, but it is peeled off or dissolved out during the developing process since it is unnecessary in the subsequent printing process. Useful protective films have transparency such that a sufficient quantity of ultraviolet rays can transmitted through the film and have a thickness of not more than 100 μm, preferably not more than 10 μm. Typical examples thereof are polyethylene, polypropylene, polyvinyl chloride, polyvinylidene chloride, polyvinyl alcohol, polyethylene terephthalate and cellophane films.

Moreover, suitable dot patterns can be applied onto the surface of the protective film by a known method as disclosed in J.P. KOKOKO No. Sho 61-11673 so as to improve the adhesion of the protective film to the positive or negative film in a vacuum printing frame.

In the method of the present invention, the silicone rubber layer of the image areas is removed by spraying a pressurized liquid on the plate surface. The method does not require the use of a brush roll or a developing pad which directly comes in contact with the plate surface, and accordingly it does not suffer wear or bending of the brush roll and the developing pad. Therefore, the method of the present invention can always ensure an excellent development quality.

Further, the equipment for carrying out the method of the present invention requires less maintenance since it is not necessary to use any developing pad or brush roll which should be exchanged when they are worn.

In addition, the method of the present invention can ensure uniform development since the method does not use any brush roll or developing pad of which uneven wear may cause uneven development.

EXAMPLES

The present invention will hereunder be explained in more detail with reference to the following non-limitative working Examples and the effects practically attained by the present invention will also be discussed in detail in comparison with Comparative Examples. In the following Examples and Comparative Examples, the term "%" means "% by weight" unless otherwise specified.

EXAMPLE 1

A smooth aluminum plate which had been degreased in a conventional manner and then treated with a sodium silicate aqueous solution was treated with a 0.1% aqueous solution of γ-aminopropyltrimethoxysilane for 10 seconds and then dried at 140° C. for one minute. A titanium white dispersion having the following composition was coated on the aluminum plate to form a primer layer in an amount of 4.0 g/m$^2$ (weighed after drying).

| Titanium White Dispersion | |
|---|---|
| Component | Amount (part by weight) |
| Paraprene P26SRNAT (available from Nippon Polyurethane Industry Co., Ltd.) | 10 |
| Tipaque R-782 (available from Ishihara Sangyo Co, Ltd.) | 1 |
| Methyl ethyl ketone | 60 |
| Dimethyl sulfoxide | 20 |

A photopolymerizable light-sensitive composition having the following composition was applied onto the aluminum plate on which the foregoing primer layer had been formed to give a light-sensitive layer of 2.0 g/m$^2$ (weighed after drying).

| Light-Sensitive Composition | |
|---|---|
| Component | Amount (part by weight) |
| Polyurethane formed from polyethylene diol of adipic acid, ethylene glycol and 1,4-butanediol; 1,4-butanediol and isophoronediisocyanate | 2 |
| Addition reaction product of glycidyl methacrylate/xylyenediamine (molar ratio = 4/1) | 0.45 |
| $CH_2=CH-CO-O-(CH_2CH_2O)_4-COCH=CH_2$ | 0.45 |
| Compound of the following formula: | 0.1 |

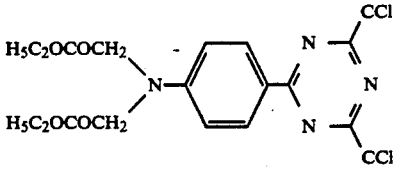

| | |
|---|---|
| Defenser MCF (fluorine atom-containing surfactant: available from Dainippon Ink & Chemicals, Inc.) | 0.1 |
| Bromophenol Blue (pH indicator) | 0.01 |
| Propylene glycol monomethyl ether | 45 |
| Methyl ethyl ketone | 7 |

A silicone rubber composition having the following formulation was applied onto the light-sensitive layer in an amount of 2.0 g/m$^2$ (weighed after drying) and then dried to give a hardened silicone rubber layer.

| Silicone Rubber Composition | |
|---|---|
| Component | Amount (part by weight) |
| Polydimethylsiloxane having hydroxyl groups on both ends (molecular weight = about 70,000) | 90 |
| Ethyltriacetoxysilane | 3 |
| Dibutyl-tin-dioctanoate | 1 |
| Isopar G (available from ESSO Chemical Company) | 1 |

A single-side-matted biaxially oriented polypropylene (OPP) film having a thickness of 9 μm was laminated with the resulting silicone rubber layer to give a dry PS plate. A positive film was put on the dry PS plate thus obtained and brought into close contact therewith under vacuum. The resulting assembly was imagewise exposed to light using a conventional exposure machine. Then the laminate film was peeled off and the plate was immersed in diethylene glycol mono-n-hexyl ether maintained at 30° C. for one minute. After the immersion and the removal of the treating solution adhered to the surface and the back of the plate with a rubber squeegee, pressurized tap water was uniformly sprayed on the plate surface at a pressure of 40 kg/cm$^2$ through a high pressure jet-spray washing machine, JB 570, available from Iwaki & Co., Ltd. to remove the silicone rubber layer of the image area. At this stage, the resulting lithographic printing plate was dyed with a 0.5% aqueous solution of Crystal Violet and it was found that only the un-exposed areas, i.e., the portions from which the silicone rubber layer was removed were dyed. Thus, there could be obtained a lithographic printing plate not requiring dampening with water on which the images of the positive film were faithfully reproduced.

Using the resulting lithographic printing plate not requiring dampening with water, printing operations were performed by mans of "Lythron" Printing Press from which the dampening water supply device had been disconnected (available from Komori Printing Machinery Co., Ltd.) and as a result, good copies of not less than 50,000 could be obtained.

EXAMPLE 2

A positive film was put on a dry PS plate, TAP (available from Toray Industries, Inc.), comprising a substrate provided thereon with a light-sensitive layer and a silicone rubber layer and brought into close contact therewith under vacuum. The resulting assembly was imagewise exposed to light using a conventional exposure machine. Then the laminate film was peeled off and the plate was immersed in polypropylene glycol (molecular weight=200) maintained at 40° C. for one minute. After the immersion, the treating solution adhered to the surface and the back of the plate was removed in the same manner as used in Example 1 and pressurized tap water was uniformly sprayed on the plate surface at a pressure of 30 kg/cm$^2$ through the same high pressure jet-spray washing machine as used in Example 1 to remove the silicone rubber layer on the image area. At this stage, the resulting lithographic printing plate was dyed in the same manner as used in Example 1 and it was found that the images of the positive film were faithfully reproduced on the resulting lithographic printing plate not requiring dampening with water.

COMPARATIVE EXAMPLE 1

The same procedures as used in Example 2 were repeated except that the pressure of the High Pressure Jet-Spray Washing Machine was controlled to 5 kg/cm$^2$.

However, the silicone rubber layer on the image areas could not sufficiently be removed and the images of the positive film could not be faithfully reproduced on the resulting lithographic printing plate not requiring dampening with water.

EXAMPLE 3

A negative film was put on a dry PS plate, TAN-E (available from Toray Industries, Inc.), comprising a substrate provided thereon with a light-sensitive layer and a silicone rubber layer and brought into close contact therewith under vacuum. The resulting assembly was imagewise exposed to light using a conventional exposure machine. Then the laminate film was peeled off and the plate was immersed in a pretreatment solution NP-1 (available from Toray Industries, Inc.) maintained at 45° C. for one minute. After the immersion, the solution adhered to the surface and the back of the plate was removed with a rubber squeegee and then pressurized tap water was sprayed on the plate surface at a pressure of 40 kg/cm$^2$ as in Example 1. At this stage, when the resulting printing plate was dyed with a solution NA-1 (available from Toray Industries, Inc.) for post treatment and it was found that only the unexposed areas, i.e., the portions from which the silicone rubber layer was removed were dyed. Thus, there could be obtained a lithographic printing plate not requiring dampening with water on which the images of the negative film were faithfully reproduced.

COMPARATIVE EXAMPLE 2

The same procedures used in Example 3 were repeated except that the pressure of the High Pressure Jet-Spray Washing Machine was controlled to 7 kg/cm$^2$.

However, the images of the negative film could not be faithfully reproduced on the resulting lithographic printing plate not requiring dampening with water.

EXAMPLE 4

A dry PS plate prepared by the same manner as used in Example 1 was imagewise exposed to light in the same manner as used in Example 1, then the laminate film was peeled off and the plate was immersed in an aqueous pretreating solution detailed below maintained at 35° C. for one minute.

| Component | Pretreating Solution Amount (part by weight) |
|---|---|
| Diethylene glycol mono-n-hexyl ether | 15 |
| New coll B4SN (available from Nippon Emulsifying Agent Manufacturing Co., Ltd., 60% aqueous solution of the compound having the following formula: | 1 |

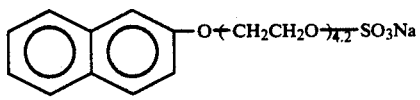

| Pure water | 84 |

After the immersion and the removal of the treating solution adhered to the surface and the back of the plate with a rubber squeegee, pressurized tap water was sprayed on the plate surface at a Pressure of 50 kg/cm$^2$ as in Example 1. At this stage, the resulting printing plate was dyed in the same manner as used in Example 1. There was obtained a lithographic printing plate not requiring dampening with water on which the images of the positive film were faithfully reproduced.

EXAMPLE 5

A dry PS plate prepared in the same manner as used in Example 1 was imagewise exposed to light in the same manner as used in Example 1. Then the laminate film was peeled off and a pressurized aqueous solution having the following composition was uniformly sprayed on the plate surface at a pressure of 45 kg/cm$^2$ with the same high pressure jet-spray washing machine as used in Example 1 to remove the silicone rubber layer of the image areas.

| Component | Aqueous Solution Amount (part by weight) |
|---|---|
| Diethylene glycol mono-n-hexyl ether | 20 |
| Diethylene glycol monoethyl ether | 12 |
| Deionized water | 68 |

Using the resulting lithographic printing plate not requiring dampening with water, printing operations were carried out in the same manner used in Example 1 and thus good copies were obtained with excellent reproduction of fine half-tone dot portions.

EXAMPLE 6

A composition for primer layer having the following formulation was applied onto the surface of a smooth aluminum plate which had been degreased in a conventional manner in an amount of 1.0 g/m² (weighed after drying) and then heated to 100° C. for 2 minutes to dry and harden the layer.

| Composition for Primer Layer | |
|---|---|
| Component | Amount (part by weight) |
| Gelatin 680 for photograph (available from Nitta Gelatin Co., Ltd.) | 100 |
| Compound of the following formula: | 11.3 |
| 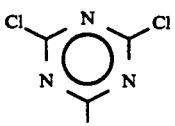 | |
| N-β-(Aminoethyl)-γ-aminopropyltrimethoxysilane | 7 |
| Pure water | 4000 |

A photopolymerizable light-sensitive composition having the following composition was applied onto the aluminum plate on which the foregoing primer layer had been formed in an amount of 1.0 g/m² (weighed after drying) and then dried.

| Photopolymerizable Light-Sensitive Composition | |
|---|---|
| Component | Amount (g) |
| Pentaerythritol triacrylate | 0.7 |
| Allyl methacrylate/sodium methacrylate copolymer (molar ratio = 80/20) | 2.0 |
| Compound of the following formula: | 0.1 |
| 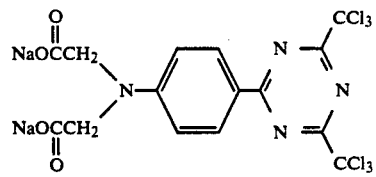 | |
| Methanol | 15 |
| Water | 25 |

Then a silicone rubber composition having the following composition was applied onto the light-sensitive layer thus formed in an amount of 1.3 g/m² (weighed after drying) and then dried to give a hardened silicone rubber layer.

| Silicone Rubber Composition | |
|---|---|
| Component | Amount (part by weight) |
| Polydimethylsiloxane having hydroxyl groups on both ends (molecular weight = about 100,000) | 100 |
| Methylhydrogenpolysiloxane having trimethylsilyl groups on both ends (molecular weight = about 2500) | 3.5 |
| 1-Trimethoxysilylpropyl-3,5-diallylisocyanurate | 6 |
| Dibutyl-tin-dioctanoate | 3.3 |
| Isopar G (available from ESSO Chemical Company) | 1800 |

A single-side-matted polypropylene film having a thickness of 12 μm was laminated on the silicone rubber layer thus formed to give a dry PS plate. The dry PS plate was imagewise exposed to light in the same manner as used in Example 1. Then the laminate film was peeled off and pressurized warm water at 45° C. was uniformly sprayed on the plate surface at a pressure of 40 kg/cm² with the same high pressure jet-spray washing machine as used in Example 1 to remove the silicone rubber layer of the image areas.

The resulting lithographic printing plate not requiring dampening with water was dyed in the same manner as used in Example 1 and it was found that the images of the positive film were faithfully reproduced thereon.

What is claimed is:

1. A method for preparing a lithographic printing plate not requiring dampening with water comprising the steps of imagewise exposing to light a presensitized plate for use in preparing a lithographic printing plate not requiring dampening with water which comprises a substrate provided thereon with a light-sensitive layer and a silicone rubber layer in that order and then spraying a pressurized liquid on the plate surface to remove the silicone rubber layer while maintaining the light-sensitive layer of the image areas said pressurized liquid having a pressure ranging from 10 to 200 Kg/cm².

2. The method of claim 1 wherein the spraying step is carried out after immersing the imagewise exposed presensitized plate in a treating solution or uniformly coating the plate surface with the treating solution.

3. The method of claim 2 wherein the immersion or coating process and the spray of the pressurized liquid are carried out in separate zones of an automatic developing machine.

4. The method of claim 2 wherein the immersion or coating process and the spray of the pressurized liquid are carried out in a single zone of an automatic developing machine.

5. The method of claim 1 wherein the spraying step is carried out while immersing the plate in a treating solution.

6. The method of claim 1 wherein the pressurized liquid and the treating solution each is selected from the group consisting of water, alcohols, glycols, esters, ketones, ethers, amines, organic acids, aliphatic hydrocarbons, aromatic hydrocarbons and mixture thereof.

7. The method of claim 6 wherein the pressurized liquid and the treating solution each is selected from the group consisting of water, methanol, ethanol, n propanol, isopropanol, 3-methoxybutanol, 3-methyl-3-methoxybutanol, ethyl carbitol, butyl carbitol, ethyl cellosolve, butyl cellosolve, benzyl alcohol, n-amyl alcohol, 1,2-butanediol, 1,3-butanediol, 1,4-butanediol, ethylene glycol, diethylene glycol, triethylene glycol, propylene glycol, dipropylene glycol, tripropylene glycol, polypropylene glycol, addition reaction product of polypropylene glycol with ethylene oxide, diethyl succinate, dimethyl phthalate, benzyl benzoate, ethylene glycol diacetate, ethyl acetate, butyl acetate, ethyl cellosolve acetate, carbitol acetate, methyl benzoate, triethyl phosphate, methyl lactate, ethyl lactate, diethyl oxalate, isobutyl acetate, acetone, methyl ethyl ketone, cyclohexanone, diisobutyl ketone, acetophenone, isophorone, ethyl ether, dioxane, tetrahydrofuran, diethylene glycol dimethyl ether, triethylene glycol dimethyl ether, triethylene glycol monomethyl ether, tripropylene glycol monomethyl ether, tripropylene glycol monobutyl ether, tripropylene glycol dimethyl ether, tetraethylene glycol monomethyl ether, tetraethylene glycol dimethyl ether, ethylene glycol mono-n-hexyl ether, diethylene glycol mono-n-hexyl ether, ethylene glycol monophenyl ether, ethylene glycol dibutyl ether, diethylene glycol di n-butyl ether, ethylene glycol benzyl ether, diethylene glycol monomethyl ether, diethylene glycol mono-n-pentyl ether, diethylene glycol mono-n-heptyl ether, diethylene glycol monooctyl ether, ethylene glycol mono-n-pentyl ether, ethylene glycol mono-n-heptyl ether, ethylene glycol monooctyl ether, propylene glycol monobutyl ether, propylene glycol monopentyl ether, propylene glycol mono-n-hexyl ether, propylene glycol monoheptyl ether, propylene glycol monooctyl ether, dipropylene glycol monomethyl ether, dipropylene glycol monobutyl ether, dipropylene glycol monopentyl ether, dipropylene glycol mono n-hexyl ether, dipropylene glycol monooctyl ether, diethylene glycol monooctenyl ether, methylamine, ethylamine, dimethylamine, trimethylamine, triethylamine, propylamine, butylamine, amylamine, dipropylamine, dibutylamine, diamylamine, tripropylamine, tributylamine, methyldiethylamine, ethylenediamine, trimethylenediamine, tetramethylenediamine, benzylamine, N,N-dimethylbenzylamine, N,N-diethylbenzylamine, o-, m- or p-methoxy or methylbenzylamine, N,N-di(methoxybenzyl)amine, β-phenylethylamine, γ-phenylpropylamine, cyclohexylamine, α- or β-naphthylamine, o-, m- or p-phenylenediamine, monoethanolamine, diethanolamine, triethanolamine, 2-methylaminoethanol, 2-ethylaminoethanol, 2 (2-aminoethyl) ethanol, 2-amino-2-methyl-1,3-propanediol, 2-amino-1,3-propanediol, 2-amino 2-hydroxymethyl-1,3-propanediol, 3-methoxypropylamine, 3-ethoxypropylamine, 3-propoxypropylamine, 3-isopropoxypropylamine, 3-butoxypropylamine, 3-isobutoxypropyla mine, 2-ethylhexyloxypropylamine, 2-ethoxyethylamine, 2-propoxyethylamine, 2-butoxyethylamine, lactic acid, acetic acid propionic acid, n-butyric acid, isobutyric acid, n-valeric acid, isovaleric acid, methylethylacetic acid, trimethylacetic acid, caproic acid, isocaproic acid, α-methylvaleric acid, 2-ethyl-n-butyric acid, enanthic acid, caprylic acid, 2-ethylhexanoic acid, hexane, heptane, Isopar E, H and G, gasoline, kerosine, toluene, and xylene.

8. The method of claim 6 wherein the pressurized liquid or treating solution is in the form of an aqueous solution containing one or more of the organic solvents, or a liquid comprising one or more of the organic solvents solubilized with a solubilizing agent or emulsified with an emulsifying agent.

9. The method of claim 6 wherein the pressurized liquid or treating solution further comprises an inorganic salt, a chelating agent, a surfactant and/or a dye.

10. The method of claim 6 wherein the pressurized liquid or treating solution is water or an aqueous solution mainly comprising water.

11. The method of claim 1 wherein the pressure of the pressurized liquid ranges from 10 to 100 kg/cm$^2$.

12. The method of claim 1 wherein the temperature of the pressurized liquid ranges from 5° to 80° C.

13. The method of claim 12 wherein the temperature of the pressurized liquid ranges from 20° to 50° C.

14. The method of claim 1 wherein the pressurized liquid is sprayed on the plate surface while the plate surface is rubbed with a brush roll or a developing pad.

* * * * *